(12) United States Patent
Choi (10) Patent No.: US 9,710,090 B2
(45) Date of Patent: Jul. 18, 2017

(54) ORGANIC LIGHT EMITTING DISPLAY DEVICE AND METHOD FOR MANUFACTURING THE SAME

(71) Applicant: LG Display Co., Ltd., Seoul (KR)

(72) Inventor: BongKi Choi, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 16 days.

(21) Appl. No.: 14/923,881

(22) Filed: Oct. 27, 2015

(65) Prior Publication Data

US 2016/0124557 A1 May 5, 2016

(30) Foreign Application Priority Data

Oct. 31, 2014 (KR) ........................ 10-2014-0150777

(51) Int. Cl.
*G06F 3/041* (2006.01)
*G06F 1/16* (2006.01)
(Continued)

(52) U.S. Cl.
CPC .......... *G06F 3/0412* (2013.01); *G06F 1/1626* (2013.01); *H01L 27/323* (2013.01); *H01L 51/5284* (2013.01); *G06F 2203/04102* (2013.01); *H01L 27/3216* (2013.01); *H01L 27/3218* (2013.01); *H01L 27/3244* (2013.01)

(58) Field of Classification Search
CPC ................ G06F 3/0412; G06F 1/1626; G06F 2203/04102; G06F 2203/04103; H01L 27/323; H01L 27/3216; H01L 27/3218; H01L 27/3244; H01L 27/3251; H01L 51/5284; H01L 51/5237; H01L 51/5253;
(Continued)

(56) References Cited

U.S. PATENT DOCUMENTS 7,663,312 B2 * 2/2010 Anandan ............. H01L 51/5243
313/498
8,860,035 B2 * 10/2014 Bae ..................... H01L 51/5253
257/40

(Continued)

FOREIGN PATENT DOCUMENTS

DE 10 2013 111909 A1 4/2014
JP 2010-243930 A 10/2010

OTHER PUBLICATIONS

Extended European Search Report for European Patent Application No. EP 15191843.0, Mar. 11, 2016, 9 pages.

*Primary Examiner* — Tom Sheng
(74) *Attorney, Agent, or Firm* — Fenwick & West LLP (57) ABSTRACT

Disclosed is a touch panel integrated organic light emitting display apparatus. The apparatus includes a substrate, a thin film transistor disposed on the substrate, an organic light emitting unit including an anode, an organic emission layer and a cathode, an anode contact unit connected to the thin film transistor and extending from the anode, an encapsulation unit configured to cover the organic light emitting unit, a low-reflective adhesive member disposed on the encapsulation unit, the low-reflective adhesive member comprising an adhesive layer and a low-reflective pattern disposed on a lower surface of the adhesive layer, and a touch panel disposed on the low-reflective adhesive member, wherein the low-reflective pattern has a visible light absorption property.

17 Claims, 8 Drawing Sheets

(51) Int. Cl.
*H01L 51/52* (2006.01)
*H01L 27/32* (2006.01)

(58) Field of Classification Search
CPC ............. H01L 51/0097; H01L 51/5206; H01L 51/5218; H01L 2251/5338
See application file for complete search history.

(56) References Cited

U.S. PATENT DOCUMENTS

| | | | | |
|---|---|---|---|---|
| 2007/0145892 | A1* | 6/2007 | Chen | H01L 51/5271 313/506 |
| 2013/0328033 | A1* | 12/2013 | Okumoto | H01L 27/3262 257/40 |
| 2013/0328034 | A1* | 12/2013 | Okumoto | H01L 27/3274 257/40 |
| 2013/0328035 | A1* | 12/2013 | Okumoto | H01L 27/1225 257/40 |
| 2013/0334513 | A1* | 12/2013 | Okumoto | H01L 27/3274 257/40 |
| 2014/0014960 | A1 | 1/2014 | Yamazaki et al. | |
| 2014/0034933 | A1* | 2/2014 | Okumoto | H01L 27/1225 257/40 |
| 2014/0306200 | A1* | 10/2014 | Jinta | H01L 27/3218 257/40 |
| 2015/0318514 | A1 | 11/2015 | Kim | |
| 2015/0333115 | A1* | 11/2015 | Yang | H01L 27/12 257/40 |
| 2016/0266436 | A1* | 9/2016 | Jiao | G02F 1/1335 |

* cited by examiner

ORGANIC LIGHT EMITTING DISPLAY DEVICE AND METHOD FOR MANUFACTURING THE SAME

CROSS-REFERENCE TO RELATED APPLICATIONS

This application claims the priority of Korean Patent Application No. 10-2014-0150777 filed on Oct. 31, 2014, in the Korean Intellectual Property Office, the disclosure of which is incorporated herein by reference in its entirety.

BACKGROUND

Field of Technology

The present disclosure relates to a touch panel integrated organic light emitting display apparatus and, more particularly, to a touch panel integrated organic light emitting display apparatus provided with a touch panel capable of enhancing an ambient contrast ratio of the organic light emitting display apparatus.

Description of the Related Art

Research has been continuously conducted on various display apparatuses to develop thin and lightweight devices that consume less power. Typical examples of such display apparatuses include a liquid crystal display (LCD), a plasma display panel (PDP), a field emission display (FED), an electro-wetting display (EWD) and an organic light emitting diode (OLED) display.

An OLED display apparatus, which is a self-luminous display device, does not require a separate light source (e.g., a backlight unit) and is therefore lightweight and made in a thin form. In addition, as the OLED display apparatus is operated at low voltage, it is advantageous in terms of power consumption. Moreover, the OLED display apparatus exhibits high performance with respect to color implementation, response time, viewing angle, and contrast ratio (CR). For these reasons, the OLED display apparatus has been regarded as a next generation display.

For a top-emission type OLED display apparatus, a transparent or semi-transparent electrode is used as a cathode in order to allow light from an organic emission layer to be emitted upward or towards a top or front surface of the OLED display apparatus. In addition, an encapsulation unit is formed on an organic light emitting unit including the organic emission layer in order to secure reliability of the OLED display apparatus. The encapsulation unit protects the organic emission layer from moisture, physical shock, or foreign particles (e.g., undesired particles, debris or dust) which may be produced during the manufacturing process. The encapsulation unit of the top-emission type OLED display apparatus is typically formed of a glass. Or, it employs a thin film encapsulation (TFE) structure in which an inorganic encapsulation layer and an organic layer are alternately laminated to delay or reduce moisture or oxygen permeation.

An OLED display apparatus may be additionally provided with a touch panel. In general, touch panels are classified into three types: an add-on type, an on-cell type, and an in-cell type. The add-on type touch panel is attached to an outer surface of the OLED display apparatus. The on-cell type touch panel is deposited on the OLED display apparatus. And the in-cell type touch panel is formed within the OLED display apparatus. Because the in-cell type touch panel is integrated into an OLED display apparatus, the OLED display apparatus having the integrated in-cell type touch panel can be relatively thinner than an OLED display apparatus having an add-on type or on-cell type touch panel.

Conventionally, portable OLED display apparatuses (such as smartphones, tablets, etc.), which are very often used in an outdoor environment, employ a circular polarizer film, capable of absorbing ambient light such that the surface reflectance of the portable OLED display apparatus can be suppressed, in order to provide high visibility in a bright environment.

SUMMARY

Recently, a flexible OLED (F-OLED) display apparatus capable of maintaining display performance even if it is bent like paper has been under development. The F-OLED display apparatus uses a flexible substrate formed of a flexible material such as plastic. When applied to a flat display apparatus, the flexible substrate is not easily damaged by external shock (e.g., shock resistance ability) or physical force.

Various techniques for integrating a touch panel into the flexible OLED display apparatus have been considered in the present invention. In particular, if the thickness of the flexible OLED display apparatus is increased due to the added touch panel, flexibility of the flexible OLED display apparatus may be decreased. Accordingly, minimizing an increase in thickness of the flexible OLED display apparatus while maintaining sufficient touch performance is required.

Research and development have been continuously carried out to commercialize an in-cell type touch panel integrated top-emission type OLED display apparatus which is lightweight, thin and has high flexibility. The conventional circular polarizer film is excessively thick and thus inapplicable to a F-OLED display apparatus. For example, when thickness of the OLED display apparatus increases, cracks or other damage occurs in the encapsulation unit, which needs to protect the organic light emitting unit from moisture even if the F-OLED display apparatus is bent or flexed numerous times.

An object of the present disclosure is to provide an in-cell type touch panel integrated F-OLED display apparatus which has a high ambient contrast ratio with respect to external visible light without a circular polarizer film for improving flexibility of the F-OLED display apparatus.

It should be noted that objects of the present disclosure are not limited to the aforementioned object, and other objects of the present disclosure will be apparent to those skilled in the art from the following descriptions.

According to an aspect of the present disclosure, there is provided an in-cell type touch panel integrated organic light emitting display apparatus including a substrate, a thin film transistor disposed on the substrate, an organic light emitting unit including an anode, an organic emission layer and a cathode, an anode contact unit connected to the thin film transistor and extended from the anode, an encapsulation unit configured to cover the organic light emitting unit, a low-reflective adhesive member (e.g., visible light absorptive material) disposed on the encapsulation unit, the low-reflective adhesive member including an adhesive layer and a low-reflective pattern at the rear surface of the adhesive layer, and a touch panel disposed on the low-reflective adhesive member, wherein the low-reflective pattern may have a visible light absorption property. That is, the low-reflective pattern may be configured to reduce reflectance of ambient light at a surface of the apparatus. Preferably, the touch panel is of the in-cell type. Also, preferably, the display apparatus is a flexible top emission OLED display apparatus. Further, in this application, "cover" or "overlap" may refer to a position of the respective elements in a top view, i.e. in the direction in which a user would watch a displayed image. Also, terms such as "rear surface" should be understood with respect to the top view direction.

The low-reflective patterns may be formed of a material absorbing 90% or more of visible light, i.e of the visible spectrum (e.g., 380 nm to 680 nm)

The encapsulation unit may include a first inorganic encapsulation layer, an organic layer disposed on the first inorganic encapsulation layer, and a second inorganic encapsulation layer disposed on the organic layer, wherein the low-reflective pattern may be in contact with the second inorganic encapsulation layer.

The in-cell type touch panel integrated organic light emitting display apparatus may further include a bank configured to cover an edge of the anode.

The low-reflective pattern may be overlapped within the bank.

The low-reflective pattern may be configured to overlap at least one portion of the anode contact unit.

The anode contact unit may be formed of the same material as the anode, wherein a shape of the anode contact unit may differ among subpixels corresponding to the organic light emitting unit.

The anode contact unit may be connected to the thin film transistor through contact holes, wherein the contact holes may be evenly spaced apart from each other.

The low-reflective pattern may be disposed only in a pixel area, wherein the organic light emitting unit is disposed in the pixel area.

The in-cell type touch panel integrated organic light emitting display apparatus may further include an auxiliary electrode electrically connected to the cathode, wherein the low-reflective pattern is disposed such that ambient light reflected from the auxiliary electrode is configured to be absorbed by the low-reflective pattern.

Other details of embodiments of the present disclosure will be clearly understood from the following detailed description taken in conjunction with the accompanying drawings.

According to an embodiment of the present disclosure, an in-cell touch panel integrated flexible OLED display apparatus having an absorption rate with respect to ambient light may be provided without requiring a circular polarizer film.

It should be noted that effects of the present disclosure are not limited to those described above and other effects of the present disclosure will be apparent from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and features of the present disclosure and methods to achieve them will become apparent from the descriptions of exemplary embodiments herein below with reference to the accompanying drawings. However, the present disclosure is not limited to the exemplary embodiments disclosed herein but may be implemented in various different forms. The exemplary embodiments are provided to make the description of the present disclosure thorough and to fully convey the scope of the present disclosure to those skilled in the art. It is to be noted that the scope of the present disclosure can be defined by the claims.

The figures, dimensions, ratios, angles, numbers of elements given in the drawings are merely illustrative and are not limiting. Further, in describing the present disclosure, descriptions of certain technical matters may be omitted in order not to obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

Elements described in this specification are interpreted as including error margins even if explicit statements are not made.

In describing positional relationship using phrases such as "an element A on an element B," "an element A above an element B," "an element A below an element B" and "an element A next to an element B," another element C may be disposed between the elements A and B unless the term "immediately" or "directly" is explicitly used.

A device or layer will be described as being disposed "on" another device or layer when the device or layer is disposed directly on another device or layer or when a third device or layer is interposed between the two devices or layers.

In describing elements, terms such as "first" and "second" are used, but the elements are not limited by these terms. These terms are simply used to distinguish one element from another. Accordingly, as used herein, a first element may be a second element within the technical idea of the present disclosure.

Like reference numerals indicate like elements throughout the descriptions.

The size and thickness of each element shown in the drawings are simply illustrative and not limiting.

Features of various exemplary embodiments of the present disclosure may be partially or fully combined. As will be clearly appreciated by those skilled in the art, various technical interactions and linked operations are possible among some or all elements the embodiments. Various exemplary embodiments can be practiced individually or in combination.

Hereinafter, a brief description will be given of an in-cell type touch panel integrated top-emission type OLED display apparatus having flexibility (e.g., flexible, bendable, rollable, foldable, stretchable, or otherwise deformable) with reference to FIGS. 1A to 1E.

Figure 1A:
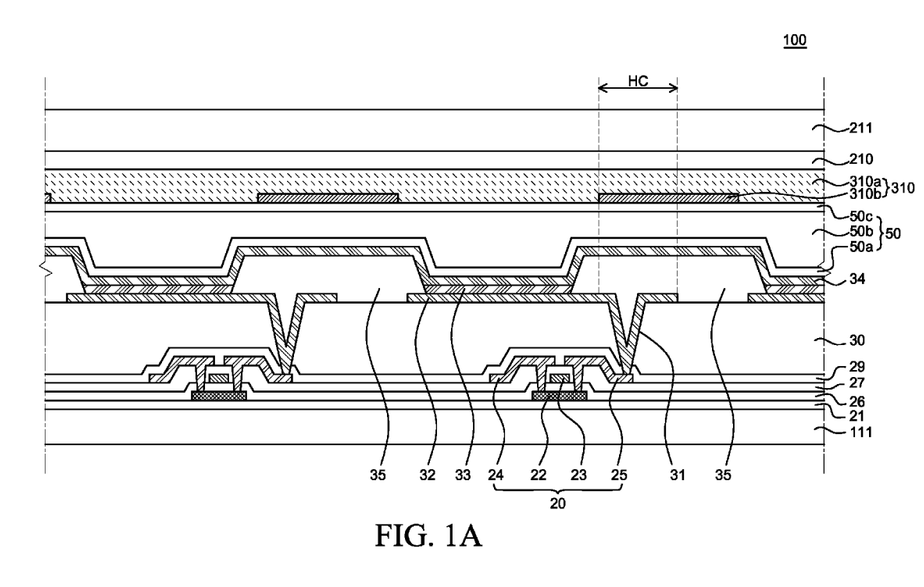
FIGS. 1A to 1E are schematic views of an OLED display apparatus according to an embodiment of the present disclosure.

Referring to FIG. 1A, an OLED display apparatus 100 according to an embodiment of the present disclosure includes a first flexible substrate 111, a thin film transistor 20 disposed on the first flexible substrate 111, an organic emission layer 33 configured to be driven by the thin film transistor 20, an encapsulation unit 50 for protecting the organic emission layer 33 from oxygen or moisture, a low-reflective adhesive member 310, a touch panel 210 and a second flexible substrate 211.

The first flexible substrate 111 may be formed by a flexible film (or other type of bendable member) formed of plastics for example, a polyimide-based material, or other appropriate material that is sufficiently flexible. A back-plate film (or other type of support means) to support the OLED display apparatus 100 may be further provided to the lower surface of the first flexible substrate 111 such that the OLED display apparatus 100 is not too easily crumbled or too easily bent. A multi-buffer layer 21 (or other type of buffer means) may be disposed between the first flexible substrate 111 and the thin film transistor 20. In the multi-buffer layer 21, silicon nitride (SiNx) and silicon oxide (SiOx) may be alternately stacked.

The thin film transistor (TFT) 20 includes an active layer 22, a gate electrode 23, a source electrode 24, and a drain electrode 25. TFTs of varying characteristics based upon type, structure, functions, etc. may be employed.

The active layer 22 (with its entirety or a portion thereof acting as a channel region) is covered by a gate insulation film 26. The gate electrode 23 is formed of the same material as a gate line and disposed on the gate insulation film 26 to overlap at least a portion of the active layer 22 (e.g., channel region).

The gate electrode 23 is covered by an inter-layer insulation film 27 (or other type of insulator), which is formed on the gate insulation film 26. The inter-layer insulation film 27 may have a double-layer structure formed of silicon nitride and silicon oxide. Other types of layer laminations are also possible.

The source electrode 24 and the drain electrode 25, which are formed of the same material as a data line, are disposed on the inter-layer insulation film 27 and spaced apart from each other. The source electrode 24 is connected to one end of the active layer 22, and also connected to the active layer 22 through a contact hole penetrating the gate insulation film 26 and the inter-layer insulation film 27. The drain electrode 25 overlaps at least the other end of the active layer 22 and is connected to the active layer 22 through a contact hole penetrating the gate insulation film 26 and the inter-layer insulation film 27. While the thin film transistor 20 is described as having a coplanar structure, a thin film transistor having an inverted staggered structure may also be employed.

A thin film transistor insulation film 29 is disposed on the thin film transistor 20. However, embodiments of the present disclosure are not limited thereto. The thin film transistor insulation film 29 may not be needed on the thin film transistor 20.

A planarization layer 30 is disposed on the thin film transistor insulation film 29. A contact hole is formed in the planarization layer 30 and the thin film transistor insulation film 29 to connect an anode 32 to the thin film transistor 20. The planarization layer 30 may be formed of photo acryl having a low dielectric constant. For example, the thickness of the planarization layer 30 is between 2 μm and 3.5 μm.

The anode 32 is formed of a metal material having a high work function. The anode 32, which is employed in a top-emission type OLED display apparatus, may be formed of a reflective material such that the anode 32 has a reflection property (or a mirror-like property). Alternatively, a separate reflecting plate (or layer) may be disposed at a lower portion of the anode 32. The separate reflecting plate is formed of a material having a high reflectivity for visible light, for example, silver (Ag), silver alloy or APC.

An anode contact unit 31 refers to an area extended from the anode 32 and connected to the thin film transistor 20 through the contact hole.

The emission area of the organic emission layer 33 may be defined by a bank 35 surrounding the organic emission layer 33. The emission area is defined as a subpixel or as at least part thereof.

The organic emission layer 33 may be configured to emit light of one of red, green, and blue (RGB) color or emit white light. When the organic emission layer 33 emits white light, a separate color filter (or color refiner) may be added.

If the organic emission layer 33 emits red light, it can be defined as a red subpixel R. If the organic emission layer 33 emits green light, it can be defined as a green subpixel G. If the organic emission layer 33 emits blue light, it can be defined as a blue subpixel B. If the organic emission layer 33 emits white light, it can be defined as a white subpixel W.

The organic emission layer 33 is disposed between a cathode 34 and the anode 32. The organic emission layer 33 may be formed of a phosphorescent material, a fluorescent material, combinations thereof, or some other light emission material, and includes an electron transporting layer (ETL), a hole transporting layer (HTL), and a charge generating layer (CGL). Additional layers related to electron, hole, and charge characteristics may be implemented. Also, various functions may be combined into or integrated as a single layer.

The cathode 34 is formed of transparent conductive oxide (TCO) or a metallic material which is very thin and has a low work function, but not limited to a particular type of work function. When the cathode 34 is formed of a metallic material, the thickness of the cathode 34 may be less than or equal to 1500 angstroms (Å). For example, the thickness of the cathode 34 can be less than or equal to 400 Å. When the cathode 34 has such relatively small thickness, the cathode 34 substantially becomes a transflective (or translucent or semi-transparent) layer. Thereby, the cathode 34 substantially becomes a transparent layer. A common voltage Vss is applied to the cathode 34.

The bank 35 typically has a tapered shape, although a variety of other shapes, profiles and cross-sections are possible. The bank 35 is disposed on the planarization layer 30. The bank 35 is formed to overlap (or partially cover) at least one portion of the edge of the anode 32. In particular, the bank 35 may overlap or cover the anode contact unit 31. For example, the height of the bank 35 can be between 1 μm and 2 μm. A spacer may be additionally disposed on the bank 35. The spacer may be formed of the same material as the bank 35. Such spacers may act to maintain a desired gap or distance between the substrates.

The encapsulation unit 50 (or some other type of barrier against moisture, oxygen, impurities, etc.) may include a first inorganic encapsulation layer 50a, an organic layer 50b and a second inorganic encapsulation layer 50c. The encapsulation unit 50 is disposed on the cathode 34. The organic layer 50b is disposed between the first inorganic encapsulation layer 50a and the second inorganic encapsulation layer 50c. The first inorganic encapsulation layer 50a may be formed of silicon nitride (SiNx) or aluminum oxide (Al2O3). The first inorganic encapsulation layer 50a is formed to be conformal according to the shape of the bank 35. The organic layer 50b may be formed of an acrylic resin, an epoxy resin, or silicon oxycarbide (SiOC). The second inorganic encapsulation layer 50c may be formed of silicon nitride or aluminum oxide. It can be understood that many other configurations and layers may be part of the encapsulation unit 50, depending upon the requirements and characteristics of the final display device product.

It is advantageous to minimize the thickness of the encapsulation unit 50 since such thickness is related to the area of a low-reflective pattern 310b, which will be described later. For example, the first inorganic encapsulation layer 50a and the second inorganic encapsulation layer 50c are formed of aluminum oxide. The layers are formed such that the thickness thereof is between 400 Å and 600 Å. For example, the organic layer 50b is formed of an epoxy resin such that the thickness thereof is between 3 µm and 10 µm. In particular, in order to make the organic layer 50b to be relatively thin, inkjet printing or electrospray coating is used. Various other types of layer providing method can be employed, as long as such technique can achieve the desired relatively thin thickness.

According to the configuration described above, the encapsulation unit 50 may be formed as a thin film, and a step (or non-uniform surface) produced by foreign particles may be compensated (or effectively covered up) by the organic layer 50b. Thus, formation of cracks or other damage in the second inorganic encapsulation layer 50c caused by foreign particles may be suppressed, and the second inorganic encapsulation layer 50c may be planarized. As a result, the low-reflective adhesive member 310 may be easily bonded to the encapsulation unit 50. Thus, defects such as bonding failure due to air gaps or other undesirable matter in a stepped portion may be significantly reduced.

The touch panel 210 is formed on the second flexible substrate 211. The touch panel 210 may be of a mutual-capacitance type or self-capacitance type. Alternatively, the touch panel 210 may be implemented by various other types of touch panels such as a resistive type touch panel or an electromagnetic type touch panel. Furthermore, so-called hybrid type touch solutions can also be implemented, whereby a combination of different touch-related technologies are employed together.

Figure 1B:
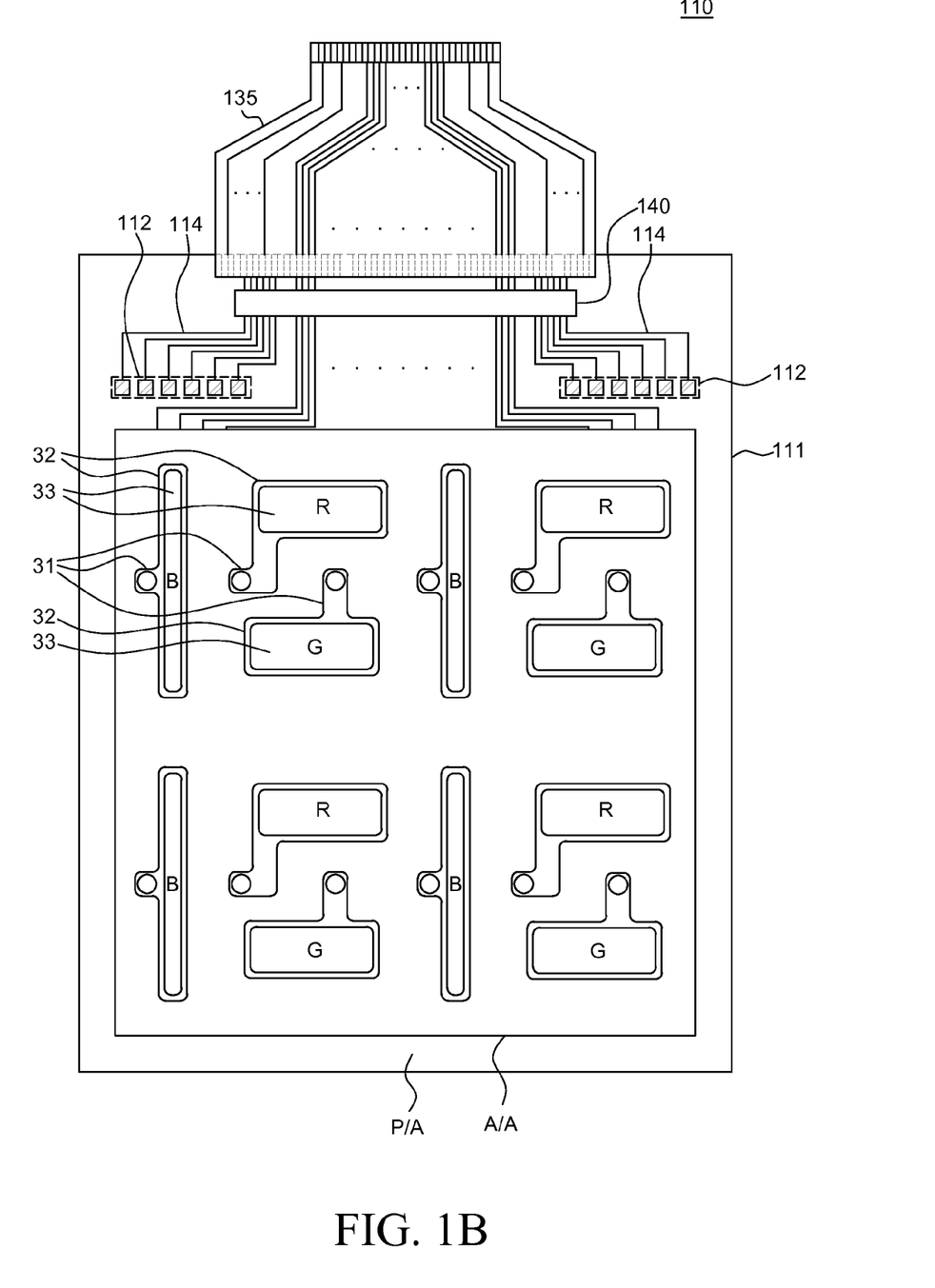
Figure 1C:
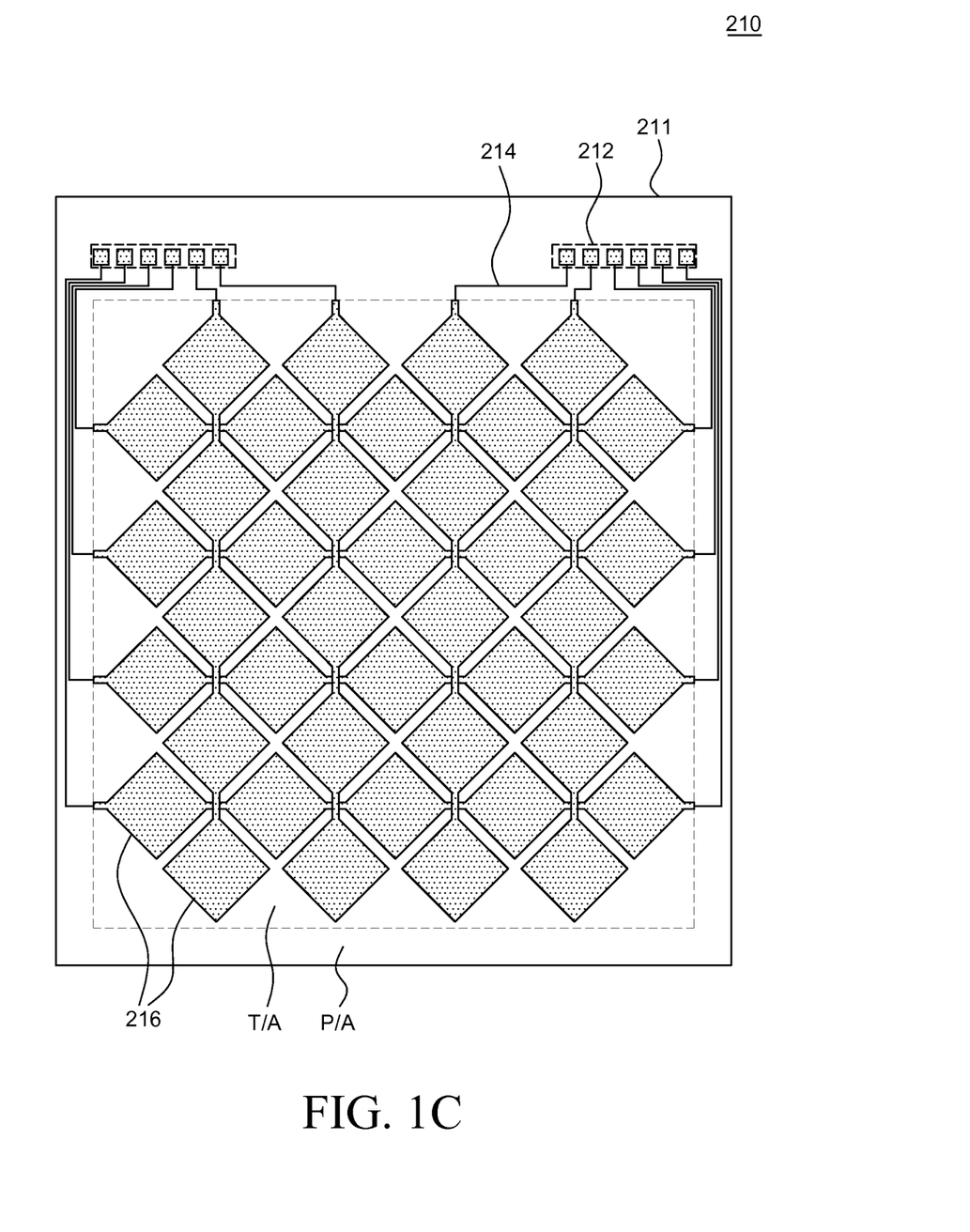

A touch electrode 216 shown in FIG. 1C may be formed as a single layer or multiple layer. For example, the touch electrode 216 may be formed by disposing a receiving electrode on the upper surface of a single substrate and a sensing electrode on the lower surface of a touch film. The above formation can be achieved by disposing the receiving electrode and the sensing electrode on one surface of the single substrate and forming a metal bridge on each electrode, or by disposing the receiving electrode and the sensing electrode separately on two substrates.

The low-reflective adhesive member 310 includes an adhesive layer 310a and a low-reflective pattern 310b.

The adhesive layer 310a has a light transmittance and adhesiveness. The adhesive layer 310a may be formed of one among an olefin-based material, an acrylic material or a silicon-based material. In particular, the adhesive layer 310a may be formed of an olefin-based hydrophobic material that retards moisture infiltration. The thickness of the adhesive layer 310a is relatively quite thin, such as between 3 µm and 12 µm. The adhesive layer 310a is formed of a material having optical transparency and transmissivity of greater than or equal to 90% of visible light.

The low-reflective pattern 310b has a visible light absorption property. For example, the low-reflective pattern 310b is formed of a material absorbing 90% or more of visible light. It should be noted that such degree (or percentage) of light absorbing property can be different, depending upon the characteristics of the low-reflective pattern to be achieved. The low-reflective pattern 310b may be formed of a carbon-based material. The low-reflective pattern 310b may be patterned using a laser patterning process or a photolithographic process. The low-reflective pattern 310b may be covered by the adhesive layer 310a. That is, the adhesive layer 310a may be disposed on the low-reflective pattern 310b.

The low-reflective pattern 310b is configured to contact the second inorganic encapsulation layer 50c. Thus, the viewing angle of the organic emission layer 33 may be increased.

The low-reflective pattern 310b is disposed to overlap (or cover) at least one region of the bank 35 between subpixels adjacent to each other. In addition, the low-reflective pattern 310b is disposed to overlap (or cover) at least one portion of the anode contact unit 31 of a corresponding subpixel. In particular, the anode contact unit 31 has high visible light reflectance and thus may lower the ambient contrast ratio. Accordingly, the low-reflective pattern 310b can sufficiently cover the anode contact unit 31. FIG. 1A shows a region HC of the anode contact unit 31 that overlaps the low-reflective pattern 310b.

According to this configuration, ambient light reflected from the anode contact unit 31, the bank 35 and the thin film transistor 20 disposed at the lower end of the planarization layer 30 may be effectively absorbed and/or reflected by the low-reflective pattern 330. Thus, the ambient contrast ratio may be enhanced.

The low-reflective pattern 310b is overlapped with the bank 35 due to the thickness of the encapsulation unit 50. That is, the bank 35 may have a larger area than the low-reflective pattern 310b. The low-reflective pattern 310b may be disposed within the area of the bank 35 so that edges of the low-reflective pattern 310b are spaced apart from edges of the bank 35. Specifically, if the end of the low-reflective pattern 310b and the end of the bank 35 are disposed at the same vertical position, apart of light laterally emitted from each subpixel is absorbed or reflected by the low-reflective pattern 310b. Thus, the viewing angle of the OLED display apparatus 100 is reduced. To address the viewing angle-related issue, the low-reflective pattern 310b is overlapped within the bank.

If the low-reflective pattern 310b is disposed excessively inside from the bank and thus the area of the low-reflective pattern 310b is reduced, the capability to absorb the ambient light is reduced. On the other hand, if the area of the low-reflective pattern 310b increases, the capability to absorb the ambient light also improves.

That is, a distance by which the end of the low-reflective pattern 310b is spaced apart from the end of the bank 35 may be determined based on the thickness of the encapsulation unit 50 and a desired viewing angle.

Referring to FIG. 1B, an organic light emitting display panel 110 includes a pixel area A/A and a periphery area P/A, which are defined on the first flexible substrate 111.

The periphery area P/A refers to an area surrounding the pixel area A/A. In the periphery area P/A, a first touch pad unit 112, a wire 114, a drive circuit unit 140, and a connection unit 135 are attached together.

The first touch pad unit 112 is electrically connected to the drive circuit unit 140 via the wire 114. Conductive balls (in the form of ACF) are disposed on the first touch pad unit 112 and electrically connected to a second touch pad unit 212, which is formed on the second flexible substrate 211 shown in FIG. 1C.

The drive circuit unit 140 processes touch signals and image signals to drive the organic light emitting display panel 110 and the touch panel 210. The drive circuit unit 140 is connected to the connection unit 135 via the wire 114. Thus, the drive circuit unit 140 receives an image signal from an external system. The drive circuit unit 140 provides the image signal to the pixel area A/A via the wire 114.

The drive circuit unit 140 is disposed on the periphery area P/A. Alternatively, the drive circuit unit 140 may be disposed on the connection unit 135. Other locations and implementations are possible, depending upon circuitry layout and design.

The connection unit 135 refers to a connection unit that electrically connects the organic light emitting display panel 110 to an external system. The connection unit 135 may be implemented by various types of interfaces or interconnection means, such as a flexible cable or a flexible printed circuit board (FPCB), but embodiments of the present disclosure are not limited thereto. The drive circuit unit 140 is mounted on the connection unit 135.

The pixel area A/A refers to an area in which an image is displayed by a plurality of subpixels. For simplicity, elements formed at the lower end of the planarization layer 30 in the pixel area A/A as shown in FIG. 1A are omitted from FIG. 1B. That is, FIG. 1B shows only the anode 32, the anode contact unit 31 and the organic emission layer 33, which are disposed on the planarization layer 30.

The pixel area A/A includes a red subpixel R, a green subpixel G, and a blue subpixel B. The organic light emitting units of the respective subpixels have different light emission efficiencies, life-span, and power consumption characteristics. Accordingly, the subpixels are specifically designed to have different emission surface areas and shapes.

According to an embodiment of the present disclosure, the red subpixel R and green subpixel G are alternately disposed in a second direction (horizontal or panel width direction), and the blue subpixel B is repeatedly disposed in a first direction (vertical direction or panel length direction). The blue subpixel B has the shape of a bar, strip or rod extending in the first direction, and the red subpixel R and green subpixel G have the shape of a bar, strip or rod extending in second direction. In particular, the blue subpixel B is longer in length than the red subpixel R and green subpixel G. In such embodiment, a higher number of pixels per inch (PPI) may be acquired by using a fine metal mask (FMM), or other type of high resolution manufacturing technique.

The anode contact unit 31 is formed of the same material as the anode 32 and configured by an extended portion of the anode electrode. The area and shape of the anode contact unit 31 differ among the R, G and B subpixels due to the disposition of the thin film transistors 20 formed at the lower end of the planarization layer 30. Specifically, the thin film transistors 20 for driving the respective subpixels are arranged in the form of a matrix in a unified structure, in contrast with the anodes 32. Accordingly, the positions of the contact holes formed on the thin film transistors 20 connected to the anodes 32 of the R, G and B subpixels are evenly spaced. Since the shapes and positions of the anodes 32 of the R, G and B subpixels do not match the contact holes formed on the thin film transistor 20, the anode contact units 31 extend from the anodes 32. In particular, the anode contact unit 31 has a high reflectivity. Accordingly, if the area of the corresponding region increases, the amount of ambient light reflection increases, and the ambient contrast ratio is lowered. Therefore, the low-reflective pattern 310b is configured to cover the anode contact unit 31.

Referring to FIG. 1C, the touch panel 210 includes a touch area T/A and a periphery area P/A, which are defined on the second flexible substrate 211.

The area of the second flexible substrate 211 is smaller than that of the first flexible substrate 111. Specifically, the second flexible substrate 211 is configured not to cover the drive circuit unit 140 and the connection unit 135.

The touch area T/A refers to an area where the touch electrodes 216 are formed to generate an electrical signal such that an input position is sensed. The touch area T/A corresponds to the pixel area A/A. This configuration is intended to allow the touch operation to work in all of the pixel area A/A.

The touch electrode 216 may be of a mutual-capacitance type or self-capacitance type. Alternatively, the touch panel 210 may be implemented by various other types of touch electrodes such as a resistive type touch electrode or an electromagnetic type touch electrode.

The touch electrode 216 may be implemented in various forms. For example, the touch electrode 216 may be implemented in various conventionally known forms such as a diamond pattern or a bar pattern.

The touch electrode 216 may be implemented using various materials. For example, the touch electrode 216 may be implemented in various conventionally known forms such as such as a transparent conductive film, a metal mesh, or a hybrid structure of a transparent conductive film and metal mesh.

The touch electrode 216 may be formed as a single layer or double layer. For example, the touch electrode 216 may be formed by disposing a receiving electrode on the upper surface of a single substrate and a sensing electrode on the lower surface of a touch film, by disposing the receiving electrode and the sensing electrode on one surface of the single substrate and forming a metal bridge on each electrode. Or, the touch electrode 216 may be formed by disposing the receiving electrode and the sensing electrode separately on two substrates.

The periphery area P/A refers to an area surrounding the touch area T/A. The second touch pad unit 212 and wires 214 are disposed in the periphery area P/A. The second touch pad unit 212 is connected to the touch electrode 216 via the wires 214.

Figure 1D:
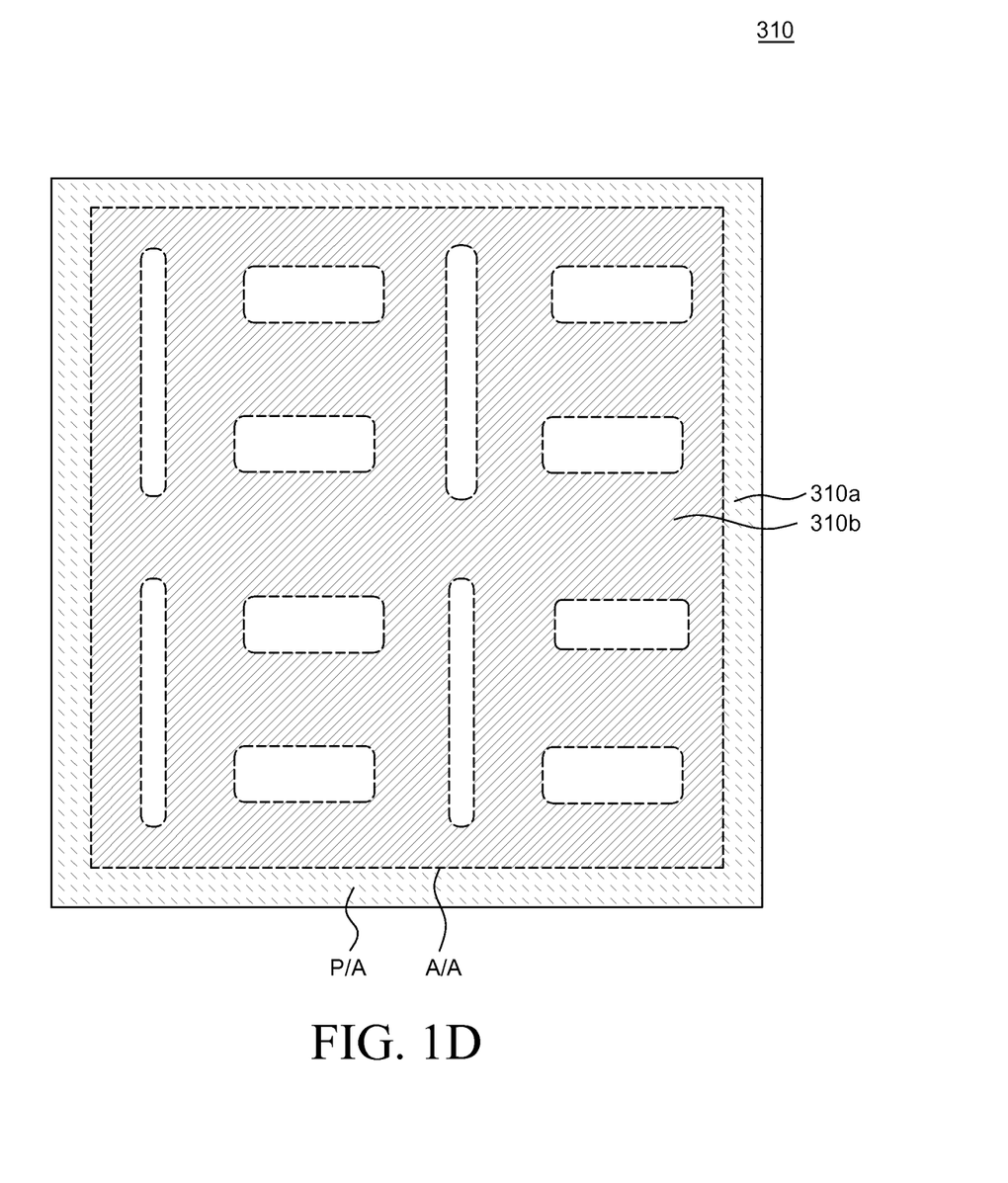

Referring to FIG. 1D, the low-reflective adhesive layer 310 includes the low-reflective pattern 310b corresponding to the pixel area A/A and the adhesive layer 310a corresponding to the periphery area P/A. Referring to FIGS. 1A and 1D, the adhesive strength of the area in which the low-reflective pattern 310b is formed is weaker than that of the area in which the low-reflective pattern 310b is not formed. Accordingly, sufficient adhesive strength may be obtained only in an area corresponding to the R, G and B subpixels where the low-reflective pattern 310b is not formed in the pixel area A/A.

For example, in order to secure sufficient adhesive strength, the low-reflective pattern 310b is not formed on the adhesive layer 310a corresponding to the periphery area P/A of the organic light emitting display panel 110. With this configuration, overall degradation of adhesive strength caused by the low-reflective pattern 310b of the pixel area A/A may be compensated.

The area of the second flexible substrate 211 is smaller than that of the first flexible substrate 111. Specifically, the second flexible substrate 211 is configured not to cover the drive circuit unit 140 and the connection unit 135. With this configuration, physical interference does not occur when the drive circuit unit 140 and the connection unit 135 are attached together.

Figure 1E:
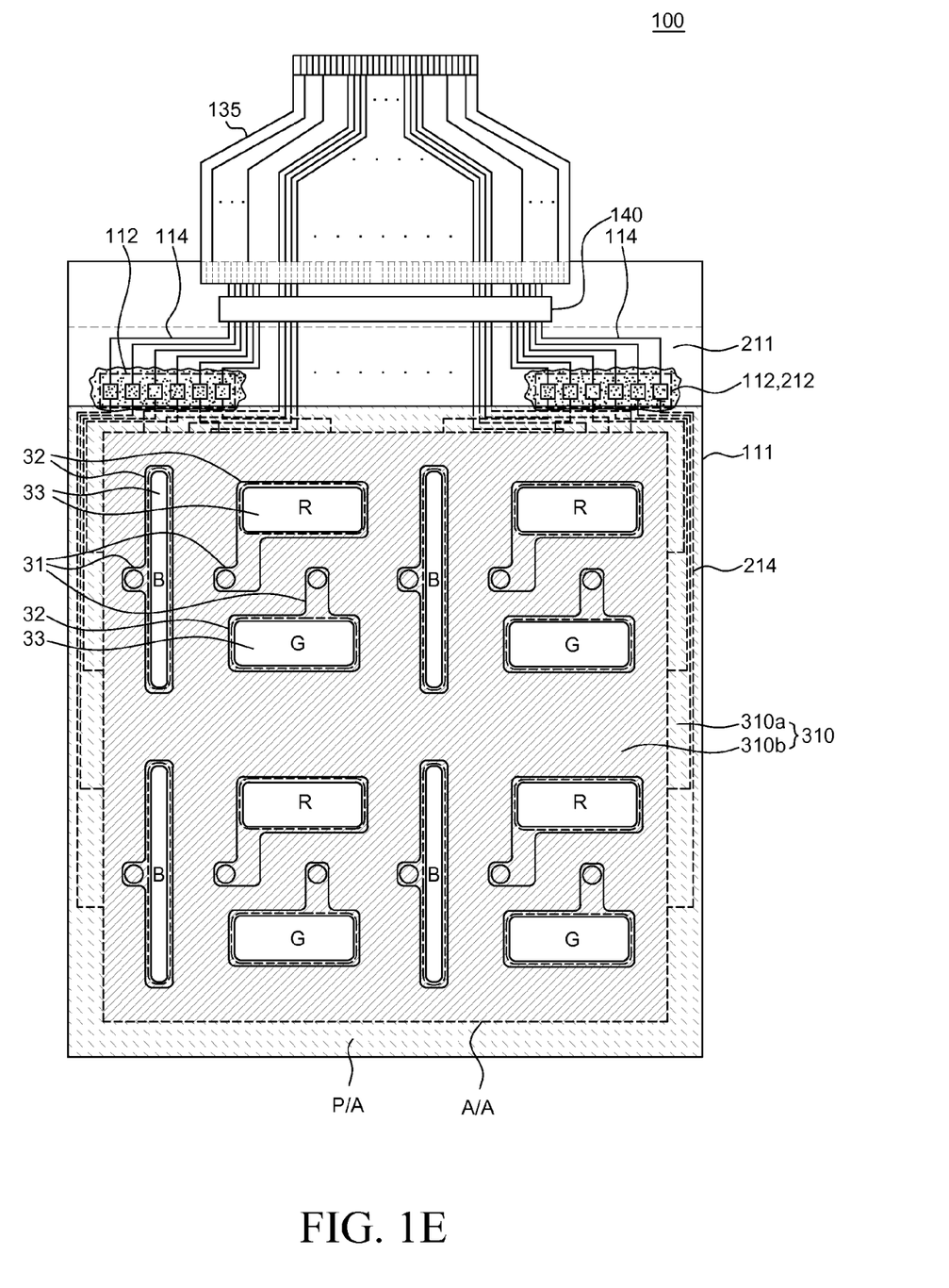

FIG. 1E shows a structure constructed by laminating the organic light emitting display panel 110, the low-reflective adhesive member 310 and the touch panel 210 one over another in a bottom-to-top manner. The first touch pad unit 112 and the second touch pad unit 212 are attached together by conductive balls (ACF). Except for the organic emission layer 33, the anode 32 and the anode contact unit 31 are covered by the low-reflective pattern 310b. Accordingly, ambient light reflection may be suppressed and the ambient contrast ratio may increase. In addition, the adhesive strength weakened by the low-reflective pattern 310b may be compensated by the adhesive layer 310a formed in the periphery area P/A. Further, since the low-reflective pattern 310b contacts the second inorganic encapsulation layer 50c, the area of the low-reflective pattern 310b may be maximized, thereby enhancing the ambient contrast ratio.

Figure 2:
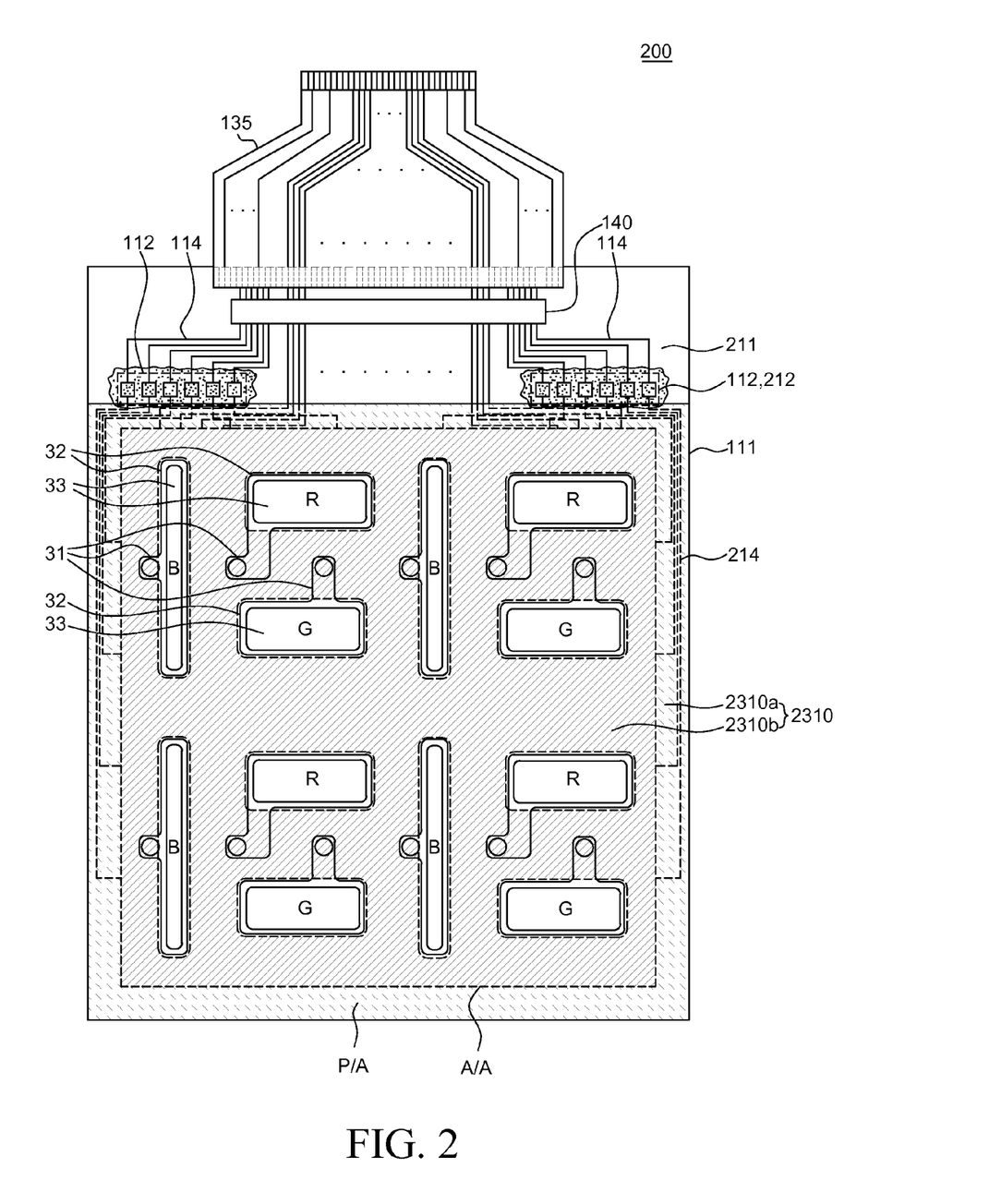
FIG. 2 is a schematic plan view illustrating a low-reflective pattern of an OLED display apparatus according to another embodiment of the present disclosure.

FIG. 2 is a schematic plan view illustrating a low-reflective pattern of an OLED display apparatus according to another embodiment of the present disclosure.

A low-reflective adhesive member 2310 of an OLED display apparatus 200 according to this embodiment is a variant of the low-reflective adhesive member 310 of the OLED display apparatus 100 according to the previous embodiment.

Referring to FIG. 2, a low-reflective pattern 2310b is spaced apart by a predetermined distance from the anodes 32, rather than covering the anodes 32. In addition, the low-reflective pattern 2310b is configured to cover at least one portion of the anode contact unit 31. With this configuration, an excellent viewing angle may be achieved even though the area of the low-reflective pattern 2310b is slightly reduced. In addition, an excellent ambient contrast ratio may be achieved regardless of the shape and area of the anode contact unit 31.

Other details of the OLED display apparatus 200 except for the configuration described above are the same as those of the OLED display apparatus 100, and thus redundant description thereof will be omitted.

Figure 3:
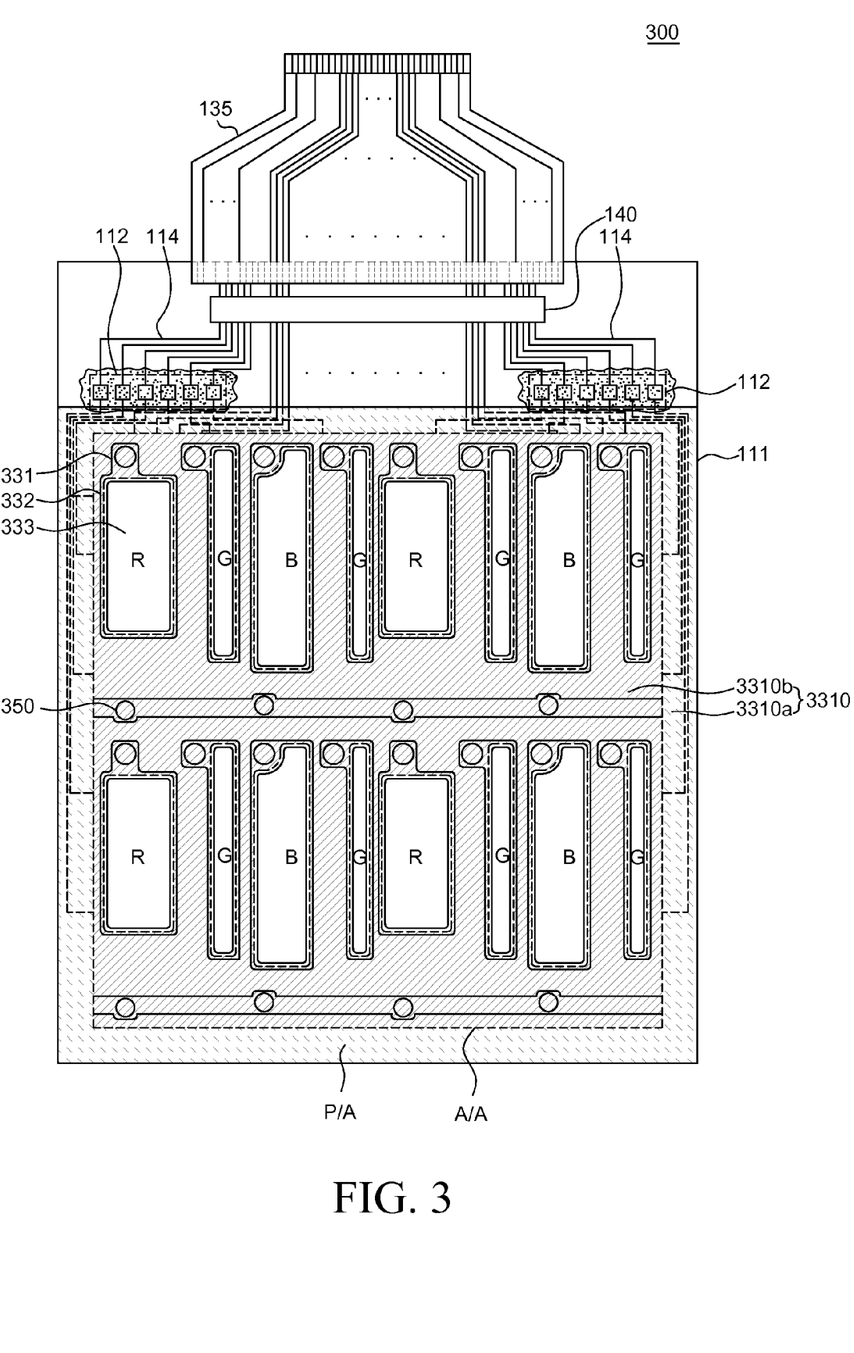
FIG. 3 is a schematic plan view illustrating a low-reflective pattern of an OLED display apparatus according to yet another embodiment of the present disclosure.

FIG. 3 is a schematic plan view illustrating a low-reflective pattern of an OLED display apparatus according to yet another embodiment of the present disclosure.

A low-reflective adhesive member 3310 of an OLED display apparatus 300 according to this embodiment is a variant of the low-reflective adhesive member 310 of the OLED display apparatus 100 according to a previous embodiment.

Referring to FIG. 3, the OLED display apparatus 300 includes R, G, B and G subpixels forming a so-called pentile structure. The OLED display apparatus 300 further includes an auxiliary electrode 350.

The auxiliary electrode 350 is formed of the same material as the anode 332. The auxiliary electrode 350 is a metal wire of low resistance that is provided to compensate voltage drop of the cathode in a large display apparatus. In particular, if the auxiliary electrode 350 is formed of the same material as the anode 332, a structure vulnerable to ambient light reflection may be formed. Yet, but the low-reflective pattern 3310b is overlapping or covering the auxiliary electrode 350, so that the ambient light may be absorbed or reflected by the low-reflective pattern 3310b.

The low-reflective pattern 3310b is spaced apart by a predetermined distance from the organic emission layer 333 and is configured to cover a part of the anode 332. For example, the predetermined distance is uniform regardless of formation of each subpixel. The low-reflective pattern 3310b is also configured to cover the entirety of the anode contact unit 331. With this configuration, an excellent viewing angle may be achieved. In addition, an excellent ambient contrast ratio may be achieved regardless of the shape and area of the anode contact unit 331.

Other details of the OLED display apparatus 300 except for the configuration described above can be the same as those of the OLED display apparatus 100 according to a previous embodiment, and thus redundant description thereof will be omitted.

Figure 4:
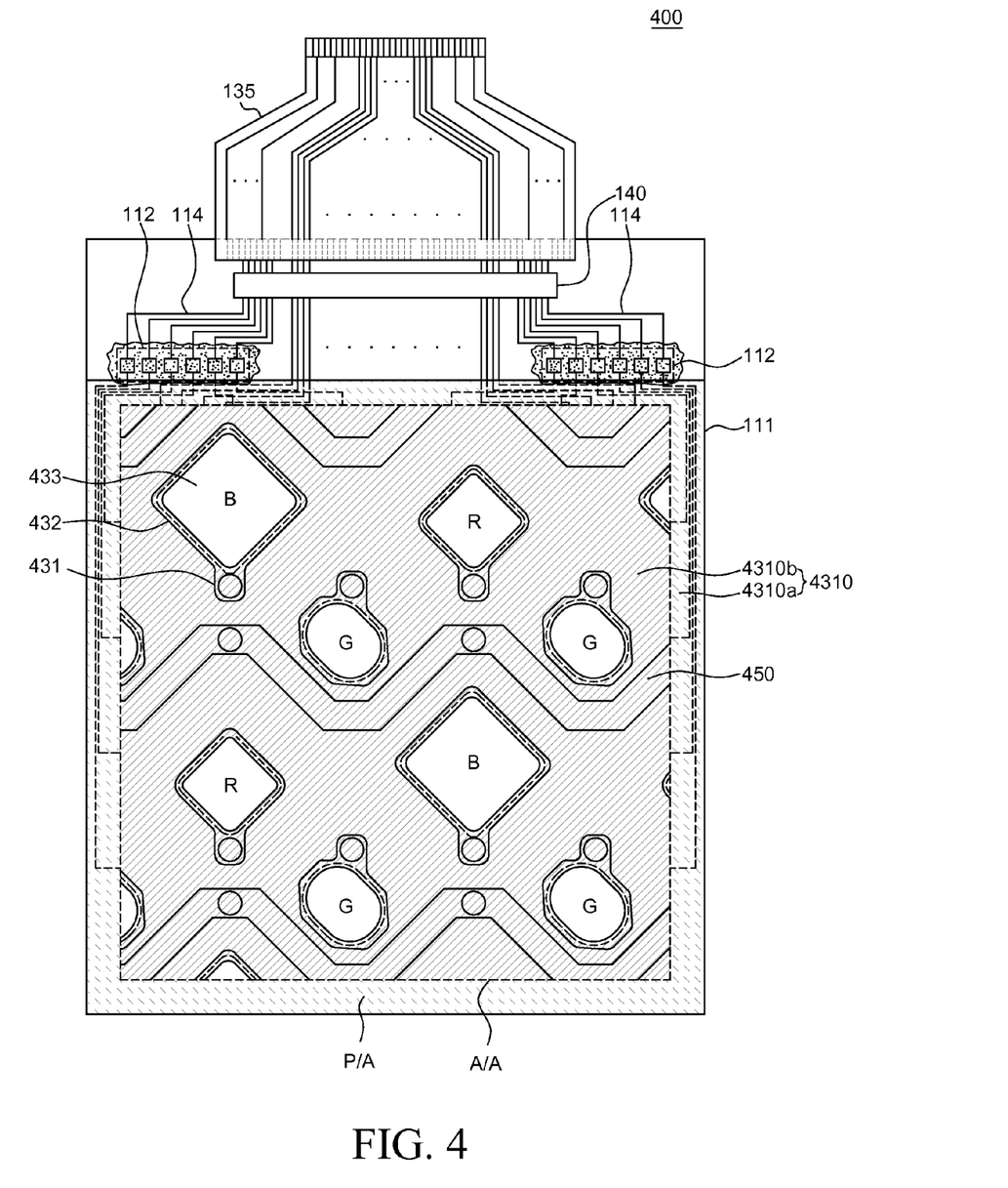
FIG. 4 is a schematic plan view illustrating a low-reflective pattern of an OLED display apparatus according to yet another embodiment of the present disclosure.

FIG. 4 is a schematic plan view illustrating a low-reflective pattern of an OLED display apparatus according to yet another embodiment of the present disclosure.

A low-reflective adhesive member 4310 of an OLED display apparatus 400 according to this embodiment is a variant of the low-reflective adhesive member 310 of the OLED display apparatus 100 according to a previous embodiment.

Referring to FIG. 4, the OLED display apparatus 400 includes R, G, B and G subpixels of a diamond pentile structure. The OLED display apparatus 400 further includes an initial line Vinit.

The initial line 450 is formed of the same material as the anode 32. The initial line 450 is a wire for discharging a signal charged in a storage capacitor. In particular, if the initial line is formed of the same material as the anode 432, a structure vulnerable to ambient light reflection may be formed. However, the ambient light may be absorbed by the low-reflective pattern 4310b. Hence, the low-reflective pattern 4310b may cover also the initial line 450.

The low-reflective pattern 4310b is spaced apart by a predetermined distance from the organic emission layer 433 and is configured to cover a portion of the anode 432. For example, the predetermined distance is uniform regardless of formation of each subpixel. The low-reflective pattern 4310b is also configured to cover the entirety of the anode contact unit 431. With this configuration, an excellent viewing angle may be achieved. In addition, an excellent ambient contrast ratio may be achieved regardless of the shape and area of the anode contact unit 431.

Other details of the OLED display apparatus 400 except for the configuration described above can be the same as those of the OLED display apparatus 100 according to a previous embodiment, and thus redundant description thereof will be omitted.

Exemplary embodiments of the present disclosure have been described in detail above with reference to the accompanying drawings. Those skilled in the art will appreciate that the present disclosure is not limited to the exemplary embodiments, and various modifications and variations can be made in the present disclosure without departing from the scope of the disclosure. Accordingly, the exemplary embodiments described herein are merely illustrative and are not intended to limit the scope of the present disclosure. The technical idea of the present disclosure is not limited by the exemplary embodiments. Therefore, the embodiments described herein should be construed in all aspects as illustrative and not restrictive. The scope of protection sought by the present disclosure should be determined by the appended claims and their legal equivalents, and all changes coming within the meaning and equivalency range of the appended claims are intended to be embraced therein.

What is claimed is:

1. An organic light emitting display apparatus comprising:
   a substrate;
   a thin film transistor on the substrate;

an organic light emitting unit on the thin film transistor, the organic light emitting unit comprising an anode, an organic emission layer and a cathode;
an anode contact unit connected to the thin film transistor and extended from the anode;
an encapsulation unit configured to cover the organic light emitting unit; and
a low-reflective pattern on the encapsulation unit,
wherein the low-reflective pattern has a visible light absorption property,
wherein the anode contact unit is formed of a same material as the anode, and
wherein a shape of the anode contact unit differs among subpixels corresponding to the organic light emitting unit.

2. The organic light emitting display apparatus according to claim 1, wherein the low-reflective pattern is formed of a material absorbing 90% or more of visible light.

3. The organic light emitting display apparatus according to claim 1, wherein the encapsulation unit comprises:
a first inorganic encapsulation layer,
an organic layer on the first inorganic encapsulation layer; and
a second inorganic encapsulation layer on the organic layer,
wherein the low-reflective pattern is in contact with the second inorganic encapsulation layer.

4. The organic light emitting display apparatus according to claim 1, further comprising a bank configured to cover an edge of the anode,
wherein the low-reflective pattern overlaps with the bank.

5. The organic light emitting display apparatus according to claim 4, wherein the low-reflective pattern is overlapped within the bank.

6. The organic light emitting display apparatus according to claim 1, wherein the low-reflective pattern is configured to overlap at least one portion of the anode contact unit.

7. The organic light emitting display apparatus according to claim 1, wherein the anode contact unit is connected to the thin film transistor through contact holes,
wherein the contact holes are evenly spaced from each other.

8. The organic light emitting display apparatus according to claim 7, wherein the anode of the subpixels does not match the contact hole, and
wherein the anode contact unit extends from the anode to the contact hole.

9. The organic light emitting display apparatus according to claim 7, wherein the subpixels comprises a red subpixel, a green subpixel and a blue subpixel,
wherein the blue subpixel is repeatedly disposed in a first direction,
wherein the red subpixel and the green subpixel are alternately disposed in a second direction,
wherein the contact hole is repeatedly disposed along a line extending in the second direction, the line being disposed between the red subpixel and the green subpixel, and
wherein the anode contact unit extends from the anode of each subpixel to the respective contact hole.

10. The organic light emitting display apparatus according to claim 7, wherein the subpixels comprises a red subpixel, a green subpixel and a blue subpixel,
wherein the red subpixel, the green subpixel and the blue subpixel are alternately disposed in a first direction as a pentile structure,
wherein the contact hole is repeatedly disposed along a line extending in the first direction, and
wherein the anode contact unit extends from the anode of each subpixel to the respective contact hole.

11. The organic light emitting display apparatus according to claim 7, wherein the subpixels comprises a red subpixel, a green subpixel and a blue subpixel,
wherein the red subpixel, the green subpixel and the blue subpixel are alternately disposed to zigzag in a first direction as a diamond pentile structure,
wherein the contact hole is repeatedly disposed along a line extending in the first direction, and
wherein the anode contact unit extends from the anode of each subpixel to the respective contact hole.

12. The organic light emitting display apparatus according to claim 1, wherein the low-reflective pattern is disposed only in a pixel area, the organic light emitting unit being disposed in the pixel area.

13. The organic light emitting display apparatus according to claim 1, further comprising an auxiliary electrode electrically connected to the cathode,
wherein the low-reflective pattern is disposed such that ambient light reflected from the auxiliary electrode is configured to be absorbed by the low-reflective pattern.

14. The organic light emitting display apparatus according to claim 1, further comprising an adhesive layer covering the low-reflective pattern.

15. The organic light emitting display apparatus according to claim 1, further comprising a touch panel on the adhesive layer.

16. The organic light emitting display apparatus according to claim 1, further comprising an initial line formed of the same material as the anode,
wherein the low-reflective pattern is configured to overlap at least a portion of the initial line.

17. The organic light emitting display apparatus according to claim 1, wherein the low-reflective pattern is spaced apart by a predetermined distance from the organic emission layer and is configured to cover at least a portion of the anode.

* * * * *